United States Patent [19]
Yoshizawa et al.

[11] Patent Number: 6,117,355
[45] Date of Patent: Sep. 12, 2000

[54] PIEZOELECTRIC CERAMIC COMPOSITION AND PIEZOELECTRIC ELEMENT USING THE PIEZOELECTRIC CERAMIC COMPOSITION

[75] Inventors: Isamu Yoshizawa, Omihachiman; Katsuhiro Horikawa; Koichi Hayashi, both of Shiga-ken; Akira Ando, Omihachiman, all of Japan

[73] Assignee: Murata Manufacturing Co., Ltd., Japan

[21] Appl. No.: 09/320,320

[22] Filed: May 26, 1999

[30] Foreign Application Priority Data

May 27, 1998 [JP] Japan ................... 10-145809
May 10, 1999 [JP] Japan ................... 11-128102

[51] Int. Cl.$^7$ ............ C04B 35/499; C04B 35/472; H01L 41/187; H01L 41/08
[52] U.S. Cl. .............. 252/62.9 R; 501/134; 310/322; 310/366; 310/365
[58] Field of Search ............ 252/62.9 R; 501/134; 310/322, 366, 365

[56] References Cited

U.S. PATENT DOCUMENTS 4,511,483  4/1985  Ogawa et al. ............. 252/62.9 R

FOREIGN PATENT DOCUMENTS 56-115584  9/1981  Japan.

OTHER PUBLICATIONS

JP 57048280 A (Murata Mfg. Co. Ltd.) Mar. 19, 1982 (abstract) World Patents Index [online] London, U.K.: Derwent Publications, Ltd. Retrieved from WPI/Derwent. DW 198217, Accession No. 1982–34193E.

*Primary Examiner*—C. Melissa Koslow
*Attorney, Agent, or Firm*—Ostrolenk, Faber, Gerb & Soffen, LLP

[57] ABSTRACT

Provided is a piezoelectric ceramic composition containing a lead titanate which has excellent temperature stability of the resonance frequency, and is suitable for application in a filter, a vibrator or the like, and a piezoelectric element using the piezoelectric ceramic composition. A piezoelectric substrate comprising a ceramic material containing $PbTiO_3$ is provided with vibrating electrodes on the front and rear surfaces. The ceramic material containing $PbTiO_3$ contains not less than about 0.1% by weight or more than about 3.0% by weight of Mn based on $MnCO_3$ as the subcomponent in the main component having a composition satisfying $0.02 \leq x \leq 0.16$ and $0.15 \leq y \leq 0.50$ of the general formula $Pb_{1-1.5x}Nd_x[(In_{1/2}Nb_{1/2})_y Ti_{1-y}]O_3$.

20 Claims, 1 Drawing Sheet

PIEZOELECTRIC CERAMIC COMPOSITION AND PIEZOELECTRIC ELEMENT USING THE PIEZOELECTRIC CERAMIC COMPOSITION

BACKGROUND OF THE INVENTION

1. Field of the Invention

The present invention relates to a piezoelectric ceramic composition and a piezoelectric element using the piezoelectric ceramic composition.

2. Description of the Related Art

Conventional piezoelectric ceramic composition containing a lead titanate ($PbTiO_3$) are known. Since a piezoelectric ceramic composition containing a lead titanate has a low dielectric constant and small particle size, it is suitable for the use in the high frequency range. Moreover, it has excellent characteristics such as ability in restraining sub-resonance due to large piezoelectric anisotropy, durability in use at a high temperature due to a high Curie point, and the like. Therefore, use of a piezoelectric ceramic containing lead titanate is indicated in the field of filters, vibrators, or the like, intended to be used in a high frequency range. However, the piezoelectric ceramic containing a lead titanate has disadvantages such as difficulty in obtaining a dense sintered compact having a large mechanical strength due to difficulty in sintering, and difficulty in polarization. In order to solve these problems, for example, a piezoelectric ceramic composition containing a lead titanate obtained by partially substituting the Pb of $PbTiO_3$ by La and adding a Mn compound such as $MnCO_3$ or the like has been used. Such piezoelectric ceramic has characteristics such as a good sintering property and capability of a polarization treatment at a high temperature in a high electric field. However, a problem is involved in that the piezoelectric ceramic has a poor temperature coefficient of the resonance frequency and thus when it is used in a filter or a vibrator, the passing frequency or the oscillating frequency changes drastically according to temperature. Therefore, it has been difficult to use a ceramic containing lead titanate in a filter or a vibrator, which are required to have a high accuracy.

SUMMARY OF THE INVENTION

Accordingly, an object of the present invention is to provide a piezoelectric ceramic composition containing a lead titanate having excellent temperature stability of the resonance frequency, suitability for application in a filter, a vibrator or the like, and a piezoelectric element using the piezoelectric ceramic composition.

In order to achieve the above-mentioned object, a piezoelectric ceramic composition according to the present invention is represented by the general formula $Pb_{1-1.5x}Nd_x[(In_{1/2}Nb_{1/2})_yTi_{1-y}]O_3$, wherein not less than about 0.1% by weight but not more than about 3.0% by weight of Mn based on $MnCO_3$ is contained as a subcomponent in a main component having a composition satisfying $0.02 \leq x \leq 0.16$ and $0.15 \leq y \leq 0.50$. According to the above-mentioned configuration, a piezoelectric ceramic composition having a good temperature coefficient of the resonance frequency can be obtained. Moreover, a piezoelectric element using the piezoelectric ceramic composition with the above-mentioned configuration can restrain the change of the passing frequency, the oscillating frequency or the like, derived from the temperature.

The amount x (substituting Nd by Pd) is set to be $0.02 \leq x \leq 0.16$ because the sintering property of the ceramic cannot be good and the improving effect of the temperature coefficient of the resonance frequency is small if $x<0.02$, and the Curie temperature is drastically deteriorated so as not to be durable at high temperature if $0.16<x$. The range of y is set to be $0.15 \leq y=0.50$ because the temperature coefficient of the resonance frequency is poor if $y<0.15$, and the Curie temperature is drastically deteriorated so as not to be durable at high temperature if $0.50<y$. The amount of Mn as the subcomponent is preferably not less than about 0.1% by weight and not more than about 3.0% by weight as $MnCO_3$. This is because the mechanical quality coefficient Qm is small so that it is not suitable for the application in a vibrator, a filter or the like, with less than about 0.1% by weight, and the insulating property of the ceramic is deteriorated so that it cannot be applied with a polarization treatment and thus it cannot be used as a piezoelectric ceramic with more than about 3.0% by weight.

DESCRIPTION OF THE PREFERRED EMBODIMENT

Figure 1:
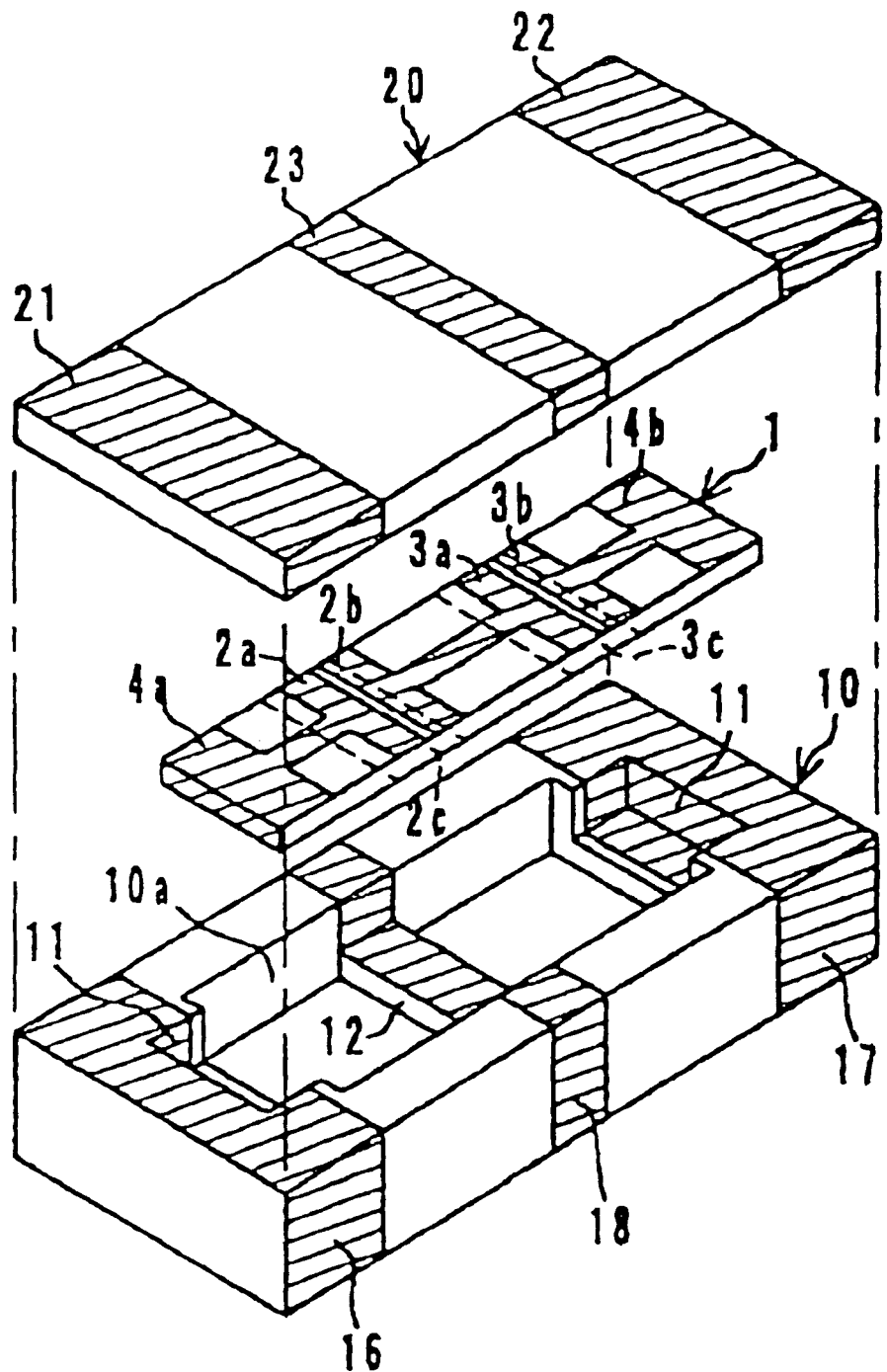
FIG. 1 is an exploded perspective view showing one embodiment of a piezoelectric element according to the present invention.

An embodiment of a piezoelectric ceramic composition and a piezoelectric element using the piezoelectric ceramic composition according to the present invention will hereinafter be explained with reference to the accompanied drawing.

As shown in FIG. 1, a piezoelectric element to be used as a piezoelectric filter comprises a piezoelectric substrate 1, an insulating container 10 accommodating the piezoelectric substrate 1, and a sealing lid 20. The piezoelectric substrate 1 has a substantially rectangular shape. The piezoelectric substrate 1 is provided with vibrating electrodes 2a, 2b, vibrating electrodes 3a, 3b on the front surface, and vibrating electrodes 2c, 3c on the rear surface. The vibrating electrodes 2a, 3b are connected electrically with lead electrodes 4a, 4b provided on the end parts of the front surface of the piezoelectric substrate 1, respectively. The vibrating electrodes 2b, 3a are connected electrically therewith via a conductor path. The lead electrodes 4a, 4b are arranged on both end parts of the substrate 1, respectively. Furthermore, the vibrating electrodes 2c and 3c are connected electrically via a conductor path provided at the rear center part of the substrate 1. The piezoelectric substrate 1 comprises a ceramic material containing $PbTiO_3$. The vibrating electrodes 2a to 3c and the lead electrodes 4a, 4b comprise Ag, Ag—Pd, Ni, Cu or the like. The piezoelectric substrate 1 generates the thickness longitudinal vibration by the vibrating electrodes 2a, 2b, 2c and the vibrating electrodes 3a, 3b, 3c.

The insulating container 10 has a concave part 10a, with notches 11 provided at both end parts of the concave part 10a. A base 12 is provided at the bottom surface center part of the concave part 10a. The piezoelectric substrate 1 is guided by the notches 11 so as to be accommodated horizontally long sideways for being supported by the notches 11 and the base 12 without contacting with the bottom surface of the concave part 10a.

The three parts, that is, the parts of the notches 11 and the base 12 of the container 10 are applied with a conductive adhesive paste so that the piezoelectric substrate 1 and the container 10 are fixed and connected electrically via the conductive adhesive. That is, lead electrodes 16, 17, 18 are formed at both end parts and the center part of the container 10 by sputtering, deposition or the like. The lead electrodes 16, 17 elongate from the notch 11 parts, respectively, and the lead electrode 18 elongates from the base 12 part. The vibrating electrode 2a is connected electrically with the lead electrode 16 of the container 10 via the lead electrode 4a and the conductive adhesive. The vibrating electrode 3b is connected electrically with the lead electrode 17 of the container 10 via the lead electrode 4b and the conductive adhesive. The vibrating electrodes 2c, 3c are connected electrically with the lead electrode 18 of the container 10 via the conductive adhesive.

The sealing lid 20 is provided with conductors 21, 22, 23 at both end parts and the center part by sputtering, deposition or the like. The sealing lid 20 is fixed to the open end face of the container 10 with an adhesive. Accordingly, the piezoelectric substrate 1 is accommodated in the sealed vibrating space provided by the container 10 and the sealing lid 20.

The composition of the piezoelectric substrate 1 will be explained. As the materials of the piezoelectric substrate 1, $Pb_3O_4$, $Nd_2O_3$, $In_2O_3$, $Nb_2O_5$, $TiO_2$ and $MnCO_3$ were used. Other oxides of Pb, Nd, In, Nb, Ti, Mn, or a compound convertible to an oxide can also be used.

The above-mentioned materials measured so as to have the compositions shown in Tables 1 to 3 were mixed and pulverized by the wet process, and calcined at 750° C. to 950° C. for 1 to 4 hours. The obtained calcined powders were pulverized with an organic binder, and press-molded with a 1 ton/cm² pressure. The molded products were baked at 1,050° C. to 1,250° C. for 1 to 4 hours so as to obtain sintered compacts. After forming an electrode, the sintered compacts were polarized by applying a 3 to 5 kV/mm electric field for 10 to 30 minutes in a silicone oil of 100° C., and evaluated. The electric mechanical coupling coefficient $k_t$ (%) at the time of the thickness longitudinal vibration, the mechanical quality coefficient Qm, the Curie temperature Tc (° C.), and the temperature coefficient of the resonance frequency F-TC (ppm/° C.) are shown in Tables 1 to 3. Those marked with * at the specimen number are comparative examples outside the range of the present invention.

TABLE 1

| Specimen number | Nd substitution x amount | $In_{1/2}Nb_{1/2}$ substitution y amount | $MnCO_3$ content (% by weight) | $k_t$ (%) | $Q_m$ | $T_c$ (° C.) | F-TC (ppm/° C.) |
|---|---|---|---|---|---|---|---|
| *1 | 0.10 | 0.20 | 0.0 | 41 | 110 | 350 | 10 |
| *2 | 0.10 | 0.00 | 0.1 | 37 | 650 | 380 | −55 |
| *3 | 0.02 | 0.01 | 0.1 | 38 | 610 | 400 | −49 |
| *4 | 0.10 | 0.01 | 0.1 | 39 | 600 | 370 | −46 |
| *5 | 0.16 | 0.01 | 0.1 | 39 | 590 | 340 | −38 |
| *6 | 0.00 | 0.15 | 0.1 | 29 | 230 | 390 | −62 |
| 7 | 0.02 | 0.15 | 0.1 | 38 | 540 | 380 | −34 |
| 8 | 0.10 | 0.15 | 0.1 | 40 | 550 | 360 | −9 |
| 9 | 0.16 | 0.15 | 0.1 | 42 | 610 | 300 | −5 |
| *10 | 0.18 | 0.15 | 0.1 | 41 | 590 | 280 | 12 |
| *11 | 0.00 | 0.20 | 0.1 | 30 | 290 | 380 | −59 |
| 12 | 0.02 | 0.20 | 0.1 | 39 | 550 | 370 | −33 |
| 13 | 0.10 | 0.20 | 0.1 | 41 | 540 | 350 | 5 |
| 14 | 0.16 | 0.20 | 0.1 | 43 | 560 | 290 | 9 |
| *15 | 0.18 | 0.20 | 0.1 | 42 | 560 | 280 | 15 |
| *16 | 0.00 | 0.35 | 0.1 | 31 | 210 | 360 | −44 |
| 17 | 0.02 | 0.35 | 0.1 | 42 | 590 | 350 | −30 |
| 18 | 0.10 | 0.35 | 0.1 | 41 | 540 | 320 | 10 |
| 19 | 0.16 | 0.35 | 0.1 | 44 | 550 | 290 | 10 |
| *20 | 0.18 | 0.35 | 0.1 | 44 | 520 | 260 | 40 |
| 21 | 0.02 | 0.50 | 0.1 | 42 | 500 | 330 | −10 |
| 22 | 0.10 | 0.50 | 0.1 | 43 | 480 | 290 | 11 |
| 23 | 0.16 | 0.50 | 0.1 | 44 | 510 | 290 | 14 |
| *24 | 0.10 | 0.60 | 0.1 | 45 | 450 | 280 | 45 |

TABLE 2

| Specimen number | Nd substitution x amount | $In_{1/2}Nb_{1/2}$ substitution y amount | $MnCO_3$ content (% by weight) | $k_t$ (%) | $Q_m$ | $T_c$ (° C.) | F-TC (ppm/° C.) |
|---|---|---|---|---|---|---|---|
| *25 | 0.10 | 0.00 | 1.0 | 36 | 2010 | 380 | −55 |
| *26 | 0.02 | 0.01 | 1.0 | 38 | 2030 | 400 | −50 |
| *27 | 0.10 | 0.01 | 1.0 | 38 | 1980 | 370 | −45 |
| *28 | 0.16 | 0.01 | 1.0 | 41 | 2000 | 370 | −40 |
| *29 | 0.00 | 0.15 | 3.0 | 36 | 1810 | 400 | −66 |
| 30 | 0.02 | 0.15 | 3.0 | 40 | 2010 | 380 | −33 |
| 31 | 0.10 | 0.15 | 3.0 | 41 | 1910 | 360 | −12 |
| 32 | 0.16 | 0.15 | 3.0 | 40 | 1920 | 300 | −10 |
| *33 | 0.18 | 0.15 | 3.0 | 39 | 2000 | 280 | 10 |
| *34 | 0.00 | 0.20 | 1.0 | 39 | 1820 | 390 | −60 |
| 35 | 0.02 | 0.20 | 1.0 | 40 | 2030 | 370 | −30 |
| 36 | 0.10 | 0.20 | 1.0 | 42 | 1990 | 350 | 2 |
| 37 | 0.16 | 0.20 | 1.0 | 42 | 2040 | 290 | 10 |
| *38 | 0.18 | 0.20 | 1.0 | 42 | 2100 | 280 | 14 |

TABLE 2-continued

| Specimen number | Nd substitution x amount | In½Nb½ substitution y amount | MnCO₃ content (% by weight) | $k_t$ (%) | $Q_m$ | $T_c$ (° C.) | F-TC (ppm/° C.) |
|---|---|---|---|---|---|---|---|
| *39 | 0.00 | 0.35 | 3.0 | 39 | 1870 | 370 | −50 |
| 40 | 0.02 | 0.35 | 3.0 | 41 | 1990 | 350 | −22 |
| 41 | 0.10 | 0.35 | 3.0 | 43 | 2000 | 320 | 8 |
| 42 | 0.16 | 0.35 | 3.0 | 43 | 1920 | 290 | 13 |
| *43 | 0.18 | 0.35 | 3.0 | 44 | 1940 | 260 | 20 |
| 44 | 0.02 | 0.50 | 1.0 | 41 | 1940 | 330 | −21 |
| 45 | 0.10 | 0.50 | 1.0 | 43 | 1960 | 290 | 9 |
| 46 | 0.16 | 0.50 | 1.0 | 45 | 1960 | 290 | 14 |
| *47 | 0.10 | 0.60 | 1.0 | 44 | 1900 | 260 | 8 |

TABLE 3

| Specimen number | Nd substitution x amount | In½Nb½ substitution y amount | MnCO₃ content (% by weight) | $k_t$ (%) | $Q_m$ | $T_c$ (° C.) | F-TC (ppm/° C.) |
|---|---|---|---|---|---|---|---|
| *48 | 0.10 | 0.00 | 3.0 | 37 | 2110 | 380 | −52 |
| 49 | 0.02 | 0.01 | 3.0 | 38 | 2040 | 400 | −49 |
| *50 | 0.10 | 0.01 | 3.0 | 39 | 2060 | 370 | −45 |
| *51 | 0.16 | 0.01 | 3.0 | 39 | 2010 | 340 | −39 |
| *52 | 0.00 | 0.15 | 3.0 | 27 | 1980 | 390 | −66 |
| 53 | 0.02 | 0.15 | 3.0 | 40 | 2020 | 380 | −36 |
| 54 | 0.10 | 0.15 | 3.0 | 41 | 2060 | 360 | −10 |
| 55 | 0.16 | 0.15 | 3.0 | 42 | 2010 | 300 | −8 |
| *56 | 0.18 | 0.15 | 3.0 | 44 | 2050 | 280 | 10 |
| *57 | 0.00 | 0.20 | 3.0 | 28 | 2000 | 380 | −62 |
| 58 | 0.02 | 0.20 | 3.0 | 40 | 1980 | 370 | −35 |
| 59 | 0.10 | 0.20 | 3.0 | 42 | 1950 | 350 | 7 |
| 60 | 0.16 | 0.20 | 3.0 | 43 | 1980 | 290 | 8 |
| *61 | 0.18 | 0.20 | 3.0 | 42 | 2060 | 270 | 12 |
| *62 | 0.00 | 0.35 | 3.0 | 39 | 2060 | 360 | −50 |
| 63 | 0.02 | 0.35 | 3.0 | 40 | 2080 | 350 | −35 |
| 64 | 0.10 | 0.35 | 3.0 | 41 | 2110 | 370 | 10 |
| 65 | 0.16 | 0.35 | 3.0 | 41 | 2000 | 290 | 11 |
| *66 | 0.18 | 0.35 | 3.0 | 40 | 2050 | 260 | 16 |
| 67 | 0.02 | 0.50 | 3.0 | 41 | 2050 | 330 | −25 |
| 68 | 0.10 | 0.50 | 3.0 | 45 | 2100 | 290 | 12 |
| 69 | 0.16 | 0.50 | 3.0 | 44 | 1980 | 290 | 14 |
| *70 | 0.10 | 0.60 | 3.0 | 44 | 1990 | 260 | 15 |

Since the specimen 1 not containing the subcomponent MnCO₃, which is outside the range of the present invention, has a mechanical quality coefficient Qm of 200 or less, it is not suitable for the application in a filter, a vibrator or the like. Moreover, if the subcomponent MnCO₃ content is increased to 5% by weight, the insulating property of the sintered compact is deteriorated so that the polarization cannot be achieved. Therefore, in the present invention, the content of the subcomponent MnCO₃ is defined to be not less than about 0.1% by weight and not more than about 3.0% by weight, wherein a preferable mechanical quality coefficient Qm can be obtained as well as the polarization operation can be conducted easily.

Moreover, as in the specimens 10, 15, 20, 33, 38, 43, 56, 61 and 66, if the amount x of substituting Pb by Nd is increased to 0.18, which is outside the range of the present invention, the Curie temperature is lowered to 280° C. or less. When the Curie temperature is 280° C. or less, the piezoelectric property of the ceramic is drastically deteriorated by reflow at the time of mounting an element utilizing a piezoelectric ceramic, such as a filer, a vibrator or the like, and thus it is not preferable. On the other hand, if the amount x of substituting Pb by Nd is 0.00 (specimens 6, 11, 16, 21, 34, 39, 52, 57, and 62), the temperature coefficient of the resonance frequency F-TC is deteriorated beyond −37 ppm/° C., and it is not suitable for the application in a filter, a vibrator or the like. With the amount x of substituting Pb by Nd in the range of the present invention, $0.02 \leq x \leq 0.16$, a piezoelectric ceramic having a temperature coefficient of the resonance frequency within ±37 ppm/° C. and a 290° C. or more Curie temperature, advantageous in the application in a filter, a vibrator or the like, can be obtained.

Furthermore, as in the specimens 24, 47 and 70, if the amount y of substituting Ti by $(In_{1/2}Nb_{1/2})$ is 0.6, which is outside the range of the present invention, the Curie temperature is lowered to 280° C. or less, and thus it is not preferable for the reason mentioned above. However, if the substitution amount by $(In_{1/2}Nb_{1/2})$ y is less than 0.15 (specimens 2 to 5, 25 to 28, and 48 to 51), the temperature coefficient of the resonance frequency F-TC is deteriorated beyond −37 ppm/° C., and thus the amount y of substituting Ti by $(In_{1/2}Nb_{1/2})$ needs to be in the range of the present invention, $0.15 \leq y \leq 0.50$ in order to obtain a ceramic having both temperature stability of the resonance frequency and heat durability.

A piezoelectric ceramic composition and a piezoelectric element using the piezoelectric ceramic composition according to the present invention are not limited to the above-mentioned embodiment, but can be modified variously within the gist hereof. In particular, the piezoelectric element is not limited to the above-mentioned embodiment, but can be a vibrator, a trap element or the like. Moreover, the vibration mode of the piezoelectric substrate can be a thickness sliding vibration mode.

As apparent from the explanation provided above, a piezoelectric ceramic composition having a good temperature coefficient of the resonance frequency and an excellent heat durability can be obtained according to the present invention. Accordingly, a piezoelectric element, such as a ceramic vibrator, a ceramic filter or the like, having an excellent temperature stability can be realized without the risk of deteriorating properties at the time of reflow soldering.

What is claimed is:

1. A piezoelectric ceramic composition comprising Pb, Nd, In, Nb and Ti, and represented by the general formula $Pb_{1-1.5x}Nd_x[(In_{1/2}Nb_{1/2})_yTi_{1-y}]O_3$, wherein $0.02 \leq x \leq 0.16$ and $0.15 \leq y \leq 0.50$ and containing not less than about 0.1% by weight but not more than about 3.0% by weight of Mn calculated as $MnCO_3$.

2. The piezoelectric ceramic composition according to claim 1 wherein x is 0.02.

3. The piezoelectric ceramic composition according to claim 1 wherein x is 0.1.

4. The piezoelectric ceramic composition according to claim 1 wherein x is 0.16.

5. The piezoelectric ceramic composition according to claim 1 wherein y is 0.15.

6. The piezoelectric ceramic composition according to claim 1 wherein y is 0.2.

7. The piezoelectric ceramic composition according to claim 1 wherein y is 0.35.

8. The piezoelectric ceramic composition according to claim 1 wherein y is 0.5.

9. The piezoelectric ceramic composition according to claim 1 wherein the amount of Mn calculated as $MnCO_3$ is about 0.1%.

10. The piezoelectric ceramic composition according to claim 1 wherein the amount of Mn calculated as $MnCO_3$ is about 3%.

11. A piezoelectric element comprising the piezoelectric ceramic composition according to claim 10 and at least one vibrating electrode.

12. A piezoelectric element comprising the piezoelectric ceramic composition according to claim 9 and at least one vibrating electrode.

13. A piezoelectric element comprising the piezoelectric ceramic composition according to claim 8 and at least one vibrating electrode.

14. A piezoelectric element comprising the piezoelectric ceramic composition according to claim 7 and at least one vibrating electrode.

15. A piezoelectric element comprising the piezoelectric ceramic composition according to claim 6 and at least one vibrating electrode.

16. A piezoelectric element comprising the piezoelectric ceramic composition according to claim 5 and at least one vibrating electrode.

17. A piezoelectric element comprising the piezoelectric ceramic composition according to claim 4 and at least one vibrating electrode.

18. A piezoelectric element comprising the piezoelectric ceramic composition according to claim 3 and at least one vibrating electrode.

19. A piezoelectric element comprising the piezoelectric ceramic composition according to claim 2 and at least one vibrating electrode.

20. A piezoelectric element comprising the piezoelectric ceramic composition according to claim 1 and at least one vibrating electrode.

* * * * *